(12) United States Patent
Brun et al.

(10) Patent No.: US 12,210,062 B2
(45) Date of Patent: Jan. 28, 2025

(54) MONITORED SWITCH GEAR DEVICE

(71) Applicant: Schneider Electric Industries SAS, Rueil Malmaison (FR)

(72) Inventors: Philippe Brun, Bernin (FR); Vladislav Kraynov, Grenoble (FR); Farid Allab, Montbonnot (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 275 days.

(21) Appl. No.: 18/095,015

(22) Filed: Jan. 10, 2023

(65) Prior Publication Data

US 2023/0228816 A1  Jul. 20, 2023

(30) Foreign Application Priority Data

Jan. 19, 2022 (EP) ..................... 22305059

(51) Int. Cl.
*G01R 31/327* (2006.01)
*G01P 3/487* (2006.01)

(52) U.S. Cl.
CPC ............ *G01R 31/327* (2013.01); *G01P 3/487* (2013.01)

(58) Field of Classification Search
CPC . G01R 31/327–3336; G01P 3/44; G01P 3/48; G01P 3/481; G01P 3/487; H01H 19/36
See application file for complete search history.

(56) References Cited

U.S. PATENT DOCUMENTS

2002/0190709 A1   12/2002  Frederick et al.
2013/0043111 A1*  2/2013   Venkitachalam ...... H01H 71/04
                                              200/329

(Continued)

FOREIGN PATENT DOCUMENTS

EP        2259074 A2     12/2010

OTHER PUBLICATIONS

European Search Report and Search Opinion dated Jul. 7, 2022 for corresponding European Patent Application No. EP22305059.2, 6 pages.

*Primary Examiner* — Huy Q Phan
*Assistant Examiner* — David B Frederiksen
(74) *Attorney, Agent, or Firm* — Locke Lord LLP

(57) ABSTRACT

A monitored switch gear device that includes a switch gear, a plurality of magnets, a magnetic field sensor and a processing circuitry. The switch gear includes an opening/closing mechanism adapted to selectively open and close an electrical circuit. The opening/closing mechanism includes a pivotally mounted shaft configured to rotate about a pivot axis as the opening/closing mechanism moves between an open and a closed state. The magnets of the plurality of magnets are spaced from each other and fixedly attached to the shaft. The magnetic field sensor senses a magnetic field generated by each magnet of the plurality of magnets as the shaft pivots. Each magnet of the plurality of magnets defines a different angular position of the shaft detected by the magnetic field sensor in which the magnetic field sensor senses a respective magnet of the plurality of magnets. The processing circuitry computes a first angular speed of the shaft based on signals provided by the magnetic field sensor when it senses the magnetic field generated by at least two magnets of the plurality of magnets as the shaft pivots in one direction.

16 Claims, 6 Drawing Sheets

(56) References Cited

U.S. PATENT DOCUMENTS

2014/0320125 A1\* 10/2014 Leeb .................... G01R 21/08
                                                              324/252
2015/0288362 A1   10/2015 Lee
2017/0187180 A1\*  6/2017 Freer .................... H01H 83/04

\* cited by examiner

120

Rotating a shaft having attached four magnets each defining a different angular position of the shaft and opening an electrical circuit of a switch gear 121

⇩

Sensing by a sensor a magnetic field generated by the magnets as the shaft rotates 122

⇩

Computing a second angular speed of the shaft based on signals provided by the magnetic field sensor when it senses the fourth and the second magnet as the shaft rotates in one direction 123

Continue rotating the shaft and computing a third angular speed of the shaft based on signals provided by the magnetic field sensor when it senses the second and the first magnet as the shaft rotates 131

FIG. 10

MONITORED SWITCH GEAR DEVICE

FIELD OF THE DISCLOSURE

The present disclosure generally relates to switch gear devices with a monitored opening and closing mechanism.

BACKGROUND OF THE DISCLOSURE

This section provides background information related to the present disclosure which is not necessarily prior art.

Conventionally, a switch gear device utilizes an opening and closing mechanism that selectively opens and closes an electrical circuit for instance via opening and closing electrical contacts embedded within the switch gear device. Such opening and closing mechanism typically contain several mechanically interconnected parts prone to wear out consequently limiting a longevity of whole switch gear device. Additionally, an external environment may further influence the longevity of the whole switch gear device causing the opening and closing mechanism to degrade prematurely when exposed for instance to an entry of humidity or excessive temperatures.

An impact of a switch gear device unexpected failure may be in some cases quite severe. Thus, rather than waiting for the opening and closing mechanism of the switch gear device to fail it is desirable to monitor its proper function and preemptively diagnose when the switch gear device needs to be replaced or repaired.

Therefore, it would be advantageous to have a switch gear device with a simple and a low cost monitored opening and closing mechanism.

SUMMARY OF THE DISCLOSURE

One aspect of the present disclosure is directed to a monitored switch gear device. The monitored switch gear device comprises a switch gear, a plurality of magnets, a magnetic field sensor and a processing circuitry. The switch gear includes an opening/closing mechanism adapted to selectively open and close an electrical circuit. The opening/closing mechanism comprises a pivotally mounted shaft configured to rotate about a pivot axis as the opening/closing mechanism moves between an open and a closed state. The magnets of the plurality of magnets are spaced from each other and fixedly attached to the shaft. The magnetic field sensor is configured to sense a magnetic field generated by each magnet of the plurality of magnets as the shaft pivots. Each magnet of the plurality of magnets defines a different angular position of the shaft in which the magnetic field sensor senses a respective magnet of the plurality of magnets. The processing circuitry is configured to compute a first angular speed of the shaft based on signals provided by the magnetic field sensor when it senses a magnetic field generated by at least two magnets of the plurality of magnets as the shaft pivots in one direction.

Additionally, the magnets of the plurality of magnets may be positioned equidistant from the pivot axis of the shaft.

Additionally, the magnetic field sensor may comprise a magneto resistive or a hall effect type sensor for the magnetic field sensing.

Additionally, the magnetic field sensor may comprise a switch type hall effect sensor and the magnetic field sensor may be configured to generate an electrical signal when it senses a magnetic field generated by a magnet of the plurality of magnets.

Additionally, the magnetic field sensor may comprise a unipolar Hall effect switch type sensor.

Additionally, the plurality of magnets may comprise four discrete magnets where each of the four discrete magnets defines an angular position of the shaft that corresponds to a specific position of the opening/closing mechanism between its open and closed state.

Additionally, an open position of the opening/closing mechanism may be defined as an angular position of the shaft of 0 degrees and the closed position of the opening/closing mechanism may be defined as an angular position of the shaft of A degrees. The four magnets may include a first magnet which may define a first angular position of the shaft of a1 degrees, a second magnet which may define a second angular position of the shaft of a2 degrees, a third magnet which may define a third angular position of the shaft of a3 degrees and a fourth magnet which may define a fourth angular position of the shaft of a4 degrees, with $a4>a3>a2>a1$.

Additionally, a1 may be comprised between 4% of A and 14% of A, a2 may be comprised between 20% of A and 36% of A, a3 may be comprised between 40% of A and 60% of A and a4 may be comprised between 70% of A and 90% of A.

Additionally, A may be comprised between 40 and 60 degrees.

Additionally, A may be comprised between 49 and 51 degrees, a1 may be comprised between 5 and 7 degrees, a2 may be comprised between 16 and 18 degrees, a3 may be comprised between 27 and 29 degrees and a4 may be comprised between 39 and 41 degrees.

Additionally, the processing circuitry may be configured to compute the first angular speed of the shaft based on signals provided by the magnetic field sensor when it senses the fourth and the third magnets as the shaft rotates and the opening/closing mechanism moves from the closed position to the open state.

Additionally, the processing circuitry may be configured to compute a second angular speed of the shaft based on signals provided by the magnetic field sensor when it registers the fourth and the second magnets as the shaft rotates and the opening/closing mechanism moves from the closed position to the open state.

Additionally, the processing circuitry may be further configured to compute a third angular speed of the shaft based on signals provided by the magnetic field sensor when it senses the second and the first magnets as the shaft continues to rotate and the opening/closing mechanism moves from the closed position to the open state.

Additionally, the processing circuitry may be configured to compute a fourth angular speed of the shaft based on signals provided by the magnetic field sensor when it senses the third and fourth magnets as the shaft rotates and the opening/closing mechanism moves from the open position to the closed state.

Additionally, the switch gear device may be a circuit breaker.

A further aspect is directed to a method of monitoring a switch gear device. The method comprising: rotating a shaft of an opening/closing mechanism and selectively opening or closing by the opening/closing mechanism an electrical circuit of a switch gear, wherein the shaft is pivotally mounted to rotate about a pivot axis and the shaft has a fixedly attached a plurality of magnets spaced from each other; sensing by a magnetic field sensor a magnetic field generated by at least two magnets of the plurality of magnets as the shaft rotates, wherein each magnet of the plurality of magnets defines a different angular position of the shaft in which the magnetic field sensor senses the magnets; and computing by a processing circuitry a first angular speed of the shaft based on signals provided by the magnetic field sensor when it senses the at least two magnets of the plurality of magnets as the shaft rotates in one direction.

Additionally, in the method the plurality of magnets may comprise four discrete magnets where each of the four discrete magnets defines a different angular position of the shaft that corresponds to a specific travel position of the opening/closing mechanism between its open and closed state.

Additionally, in the method an open position of the opening/closing mechanism may be defined as an angular position of the shaft of 0 degrees and the closed position of the opening/closing mechanism is defined as an angular position of the shaft of A degrees. The four magnets may include a first magnet which defines a first angular position of the shaft of a1 degrees, a second magnet which defines a second angular position of the shaft of a2 degrees, a third magnet which defines a third angular position of the shaft of a3 degrees and a fourth magnet which defines a fourth angular position of the shaft of a4 degrees, with a4>a3>a2>a1.

Additionally, in the method a1 may be comprised between 4% of A and 14% of A, a2 may be comprised between 20% of A and 36% of A, a3 may be comprised between 40% of A and 60% of A and a4 may be comprised between 70% of A and 90% of A.

Additionally, in the method A may be comprised between 40 and 60 degrees.

Additionally, in the method A may be comprised between 49 and 51 degrees, a1 may be comprised between 5 and 7 degrees, a2 may be comprised between 16 and 18 degrees, a3 may be comprised between 27 and 29 degrees and a4 may be comprised between 39 and 41 degrees.

Additionally, the method may comprise: rotating the shaft of the opening/closing mechanism and opening the electrical circuit of the switch gear; and computing by the processing circuitry the first angular speed of the shaft based on signals provided by the magnetic field sensor when it senses the fourth and the third magnet as the shaft rotates.

Additionally, the method may comprise: rotating the shaft of the opening/closing mechanism and opening the electrical circuit of the switch gear; and computing a second angular speed of the shaft based on signals provided by the magnetic field sensor when it senses the fourth and the second magnet as the shaft rotates.

Additionally, the method may further comprises continue rotating the shaft and computing a third angular speed of the shaft based on signals provided by the magnetic field sensor when it senses the second and the first magnet as the shaft rotates.

Additionally, the method may comprise rotating the shaft of the opening/closing mechanism and closing the electrical circuit of the switch gear and computing a fourth angular speed of the shaft based on signals provided by the magnetic field sensor when it senses the third and fourth magnets as the shaft rotates in one direction.

Additionally, in the method the switch gear device may be a circuit breaker or a contactor.

In a further aspect, the method of monitoring a switch gear device can be used in conjunction with, or as a part of, the monitored switch gear device as defined above.

Further areas of applicability will become apparent from the description herein. The description and specific examples in the summary are intended for purposes of illustration only and are not intended to limit the scope of the present disclosure.

BRIEF DESCRIPTION OF THE DRAWINGS

Other features and advantages of the invention appear from the following detailed description of some of its embodiments, given by way of non-limiting example, and with reference to the accompanying drawings, in which:

FIG. 9 depicts another exemplary flow diagram of the opening phase of the switch gear device in the method of monitoring a switch gear device.

FIG. 10 depicts an exemplary optional step for the methods depicted in any of the FIGS. 7 to 9.

DETAILED DESCRIPTION

Figure 1:
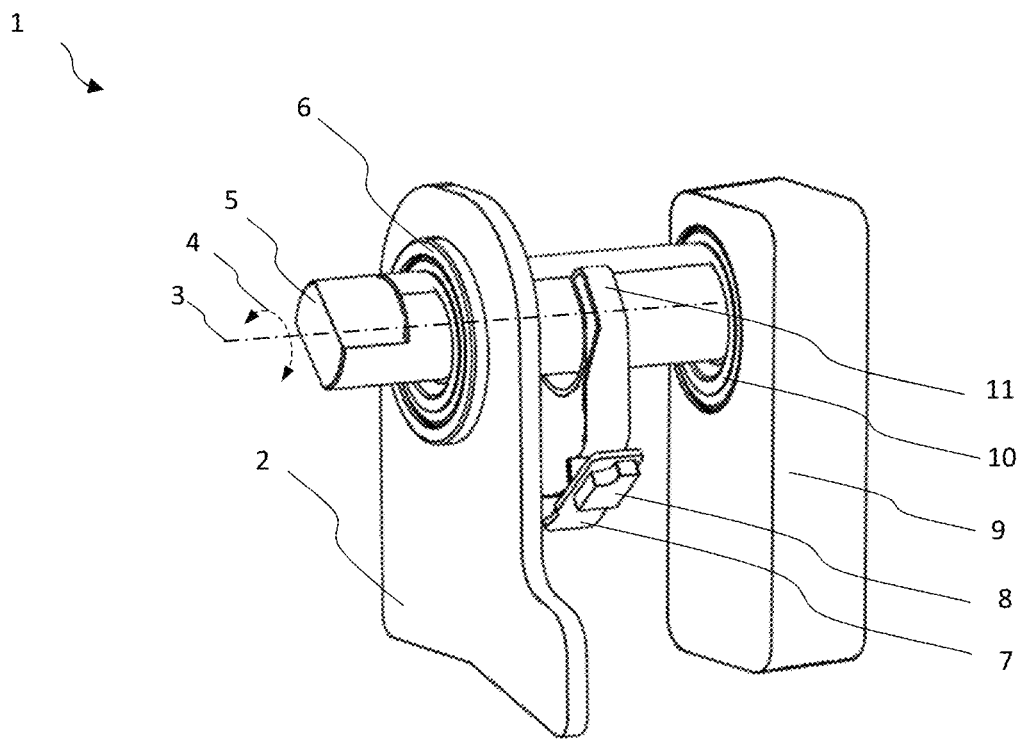
FIG. 1 depicts a simplified perspective view of a monitored switch gear device in an illustrative embodiment.

The foregoing summary, as well as the following detailed description of certain examples will be better understood when read in conjunction with the appended drawings. As used herein, an element or step recited in the singular and proceeded with the word "a" or "an" should be understood as not excluding plural of the elements or steps, unless such exclusion is explicitly stated. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

In the figures, the same references denote identical or similar elements, unless stated otherwise. In the drawings, the size of each element or a specific portion constituting the element is exaggerated, omitted, or schematically shown for convenience and clarity of description. Thus, the size of each component may not entirely reflect the actual size. In the case where it is judged that the detailed description of the related known functions or constructions may unnecessarily obscure the gist of the present disclosure, such explanation will be omitted.

Turning now to FIG. 1, a simplified perspective view of a monitored switch gear device 1 is depicted. The monitored switch gear device 1 comprises of a switch gear 9 including an opening/closing mechanism. The opening/closing mechanism selectively opens and closes an electrical circuit (not shown). The electrical circuit may comprise one or more electrical contacts actuated by the opening/closing mechanism. The electrical contacts may be comprised within the switch gear 9 and actuated by the opening/closing mechanism. The opening/closing mechanism has a pivotally mounted shaft 5 that rotates in the direction of double arrow 4 about a pivot axis 3 as the opening/closing mechanism moves between an open and a closed state. The shaft 5 may be pivotally held 6 in a bracket 2 made for instance of a metal sheet or a plastic composite. The shaft 5 may be on one side pivotally held inside a plain bearing attached to the bracket 2 or held within the bracket 2. The shaft 5 may have attached a plurality of magnets (shown in FIG. 2) that are spaced from each other. The magnets may be attached to the shaft via an optional holder 11 coupled to the shaft 5. The monitored switch gear device 1 further has a magnetic field sensor 7 configured to sense a magnetic field generated by each magnet of the plurality of magnets as the shaft 5 pivots. The magnetic field sensor 7 may be rigidly coupled to the bracket 2 so that it does not move when the shaft pivots 5. The magnetic field sensor 7 may face a one side of the holder 11 where the plurality of magnets is held. The magnetic field sensor 7 may sense the magnetic field generated by each magnet of the plurality of magnets (shown in FIG. 2) as the shaft 5 pivots 4 about the pivot axis 3 and magnets of the plurality of magnets passes the magnetic field sensor 7. The magnetic field sensor 7 may comprise a one or more magneto resistive and/or hall effect type sensor(s) for the magnetic field sensing. When the magnetic field sensor comprises a magneto resistive type sensor it may be a giant magnetoresistance (GMR) type sensor. The magnetic field sensor 7 may also comprise a one or more switch type Hall effect sensor. The magnetic field sensor 7 may be configured to generate an electrical signal when it senses a magnet of the plurality of magnets. Sensing a magnet by the magnetic field sensor 7 means sensing or registering a magnetic field of the magnet by the magnetic field sensor 7. A processing circuitry 8 is depicted in proximity of the magnetic field sensor 7, however, the processing circuitry 8 may be located elsewhere. The processing circuitry 8 computes a first angular speed of the shaft 5 based on signals provided by the magnetic field sensor 7 when it senses at least two magnets of the plurality of magnets as the shaft 5 pivots in one direction.

Figure 2:
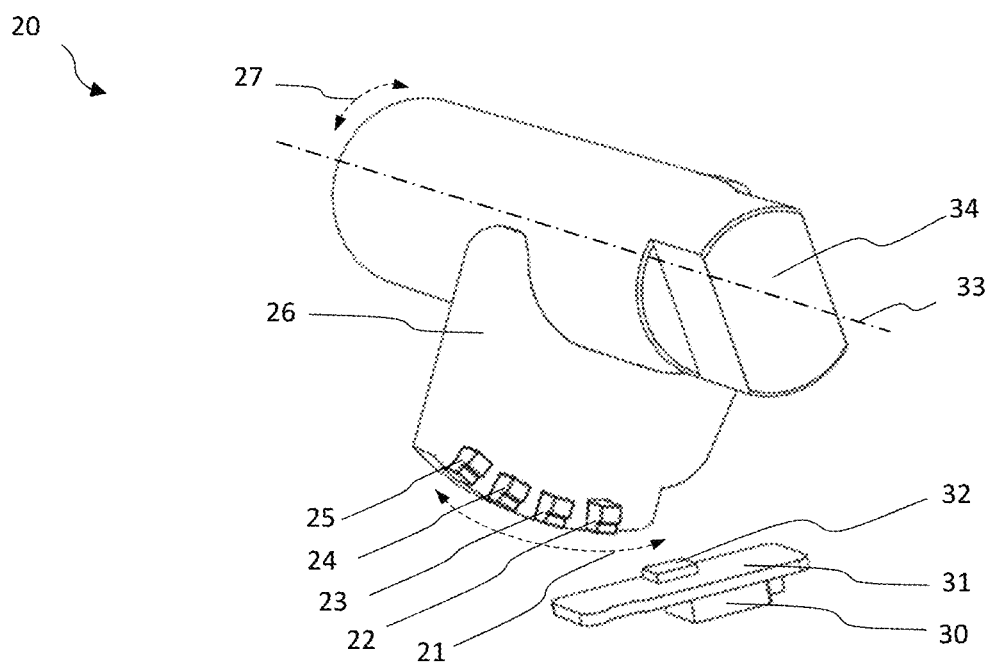
FIG. 2 depicts a perspective simplified view of a portion of the monitored switch gear in an illustrative embodiment.

Moving to FIG. 2, an exemplary perspective simplified view of a portion 20 of the monitored switch gear device 1 is depicted. In this exemplary view the shaft 34 is pivotable about a pivot axis 33 as shown by the arrows 27. The plurality of magnets 22, 23, 24, 25 are attached to the shaft 34 via a holder 26 connected to the shaft 34. Shown in the figure the plurality of magnets comprises four discrete magnets 22, 23, 24, 25 where each of the four discrete magnets 22, 23, 24, 25 defines an angular position of the shaft that corresponds to a specific position of the opening/closing mechanism between its open and closed state. There may be a different number, for instance 2, 3 or 5 or more, of magnets comprised in the plurality of magnets. The magnets of the plurality of magnets 22, 23, 24, 25 are spaced from each another and located on a one side of the holder 26. The magnets 22, 23, 24, 25 may be positioned equidistant from the pivot axis 33 of the shaft 34. The magnetic field sensor 32 is located to face the side of the holder 26 on which the magnets 22, 23, 24, 25 are arranged. The magnetic field sensor senses a magnetic field generated by each magnet 22, 23, 24, 25 of the plurality of magnets as the shaft 34 rotates about the pivot axis 33 and magnets of the plurality of magnets passes the magnetic field sensor 32. Then each magnet 22, 23, 24, 25 of the plurality of magnets defines a different angular position of the shaft 34 in which the magnetic field sensor 32 respectively senses the magnets 22, 23, 24, 25 of the plurality of magnets. The magnetic field sensor 32 may be attached to a printed circuit board (PCB) 31 to which the processing circuitry 30 may be also attached.

Figure 3:
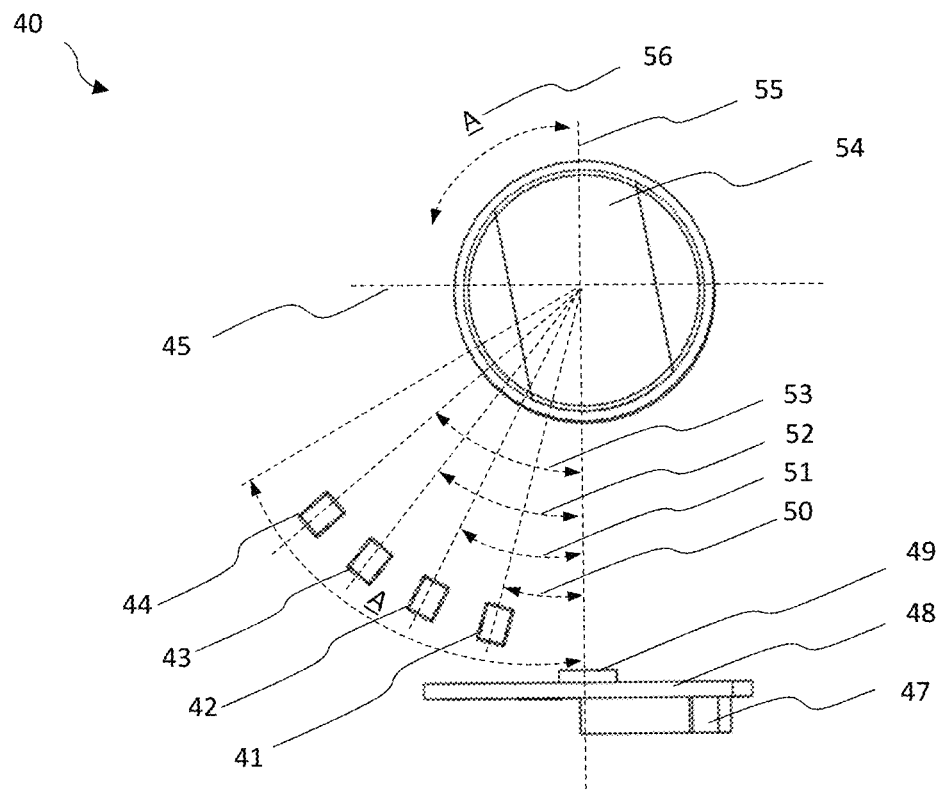
FIG. 3 depicts a simplified side view showing magnets angular arrangement with respect to the shaft and the sensor in an illustrative embodiment.

Moving to FIG. 3, showing a side view of an exemplary arrangement of the plurality of magnets 41, 42, 43, 44 with respect to the shaft 54 and the magnetic field sensor 49. The magnets 41, 42, 43, 44 are fixedly attached to the shaft 55. The shafts pivots about an axis that is perpendicular to the shown axis 45 and 55. The magnets 41, 42, 43, 44 may be attached to the shaft 55 via a holder as shown in FIG. 2. The plurality of magnets is formed by four discrete magnets 41, 42, 43, 44, however, there may be a different number of discrete magnets such as 2, 3, 5 or more magnets. Each of the discrete magnets 41, 42, 43, 44 defines an angular position 50, 51, 52, 53 of the shaft 54 that corresponds to a specific position of the opening/closing mechanism between its open and closed state. As the shaft 54 pivots in one of directions 56 the plurality of magnets passes in proximity of the magnetic sensor 49. The magnetic field sensor 49 senses a magnetic field of each of the discrete magnets of the plurality of magnets 41, 42, 43, 44 as they pass in proximity of it. The magnetic field sensor 49 may be attached to a printed circuit board (PCB) 48 to which the processing circuitry 47 may be also attached. Angular movement of the opening/closing mechanism between its open and closed state is represented by an arc line with arrows A. One benefit of such angular arrangement of discrete magnets 41, 42, 43, 44 in relation to the shaft 54 and the sensor 49 is that when the opening/closing mechanism moves to selectively opens or closes an electrical circuit, then via the related pivot of the shaft 54 a signal from the magnetic field sensor 49 can be utilized to monitor progress of the opening or closing of the electrical circuit and consequently monitor the switch gear operation.

Depending on the monitored switch gear, an angular position and number of discrete magnets may vary. In one exemplary implementation an open position of the opening/closing mechanism is defined as an angular position of the shaft 54 with respect to the sensor as 0 degrees and the closed position of the opening/closing mechanism is defined as an angular position of the shaft 54 of A degrees. The discrete magnets of the plurality of magnets 41, 42, 43, 44 may include a first magnet 41 which defines a first angular position 50 of the shaft 54 of a1 degrees, a second magnet 42 which defines a second angular position 51 of the shaft of a2 degrees, a third magnet 43 which defines a third angular position 53 of the shaft of a3 degrees and a fourth magnet 44 which defines a fourth angular position 53 of the shaft 54 of a4 degrees, with a4>a3>a2>a1.

In one exemplary implementation a1 is comprised between 4% of A and 14% of A, a2 is comprised between 20% of A and 36% of A, a3 is comprised between 40% of A and 60% of A and a4 is comprised between 70% of A and 90% of A. Shafts 54 complete angular movement in one direction A may be comprised between 40 and 60 degrees. In yet another exemplary implementation A is comprised between 49 and 51 degrees, a1 is comprised between 5 and 7 degrees, a2 is comprised between 16 and 18 degrees, a3 is comprised between 27 and 29 degrees and a4 is comprised between 39 and 41 degrees.

Figure 4:
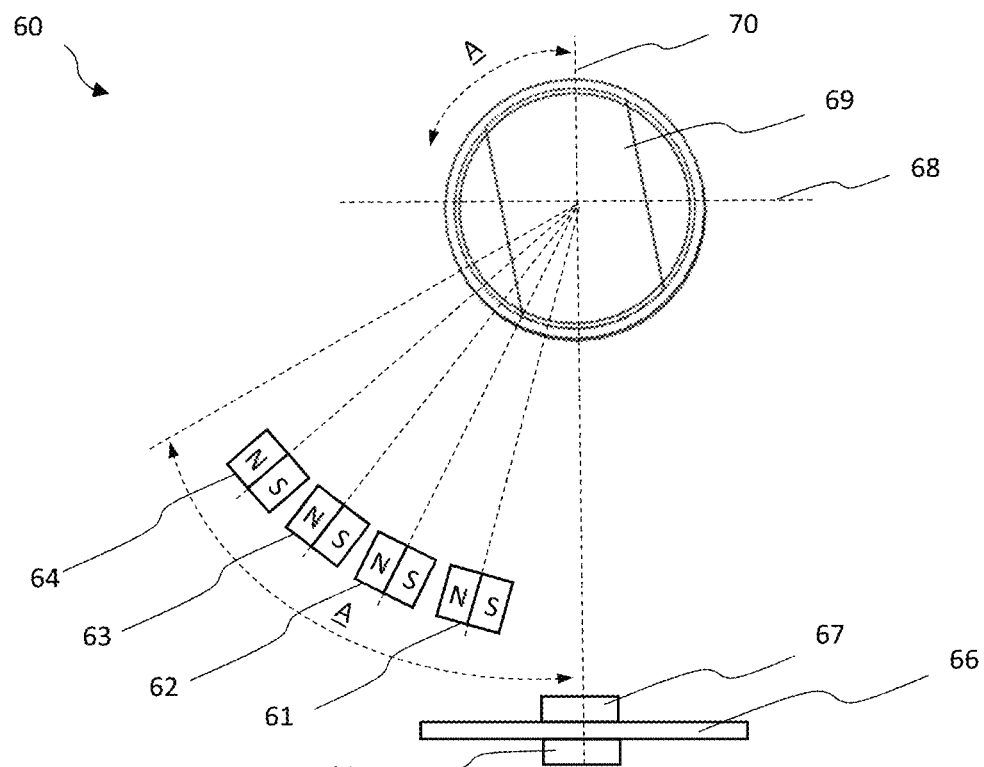
FIG. 4 depicts an illustrative embodiment of FIG. 3 showing an exemplary magnetization arrangement of magnets.

Moving to FIG. 4, showing an exemplary arrangement of the plurality of discrete magnets as described in the embodiment of FIG. 3. As shown each discrete magnet of the plurality of magnets 61, 62, 63, 64 is directionally magnetized so that it has both North and South magnetic pole on the side that passes the magnetic field sensor 67 as the shaft 69 pivots. Each discrete magnet of the plurality of magnets 61, 62, 63, 64 may be a permanent magnet made of NdFeB (Neodium Iron Bore) or SmCo (Samarium Cobalt) or AlNiCo (Aluminum Nickel Co-bait) and may have its remanence Br equal or higher than 0.9 Tesla (9 000 Gauss). Preferably, each discrete magnet of the plurality of magnets 61, 62, 63, 64 may be a permanent magnet and may have its remanence Br comprised between 0.9 Tesla (9 000 Gauss) and 1.5 Tesla (15 000 Gauss). An airgap between a center of the magnetic field sensor 67 and a center of a respective passing magnet 61, 62, 63, 64 as the shaft pivots may be comprised between 1 milli-meter and 2.4 millimeters.

Further, the magnetic field sensor 67 is arranged to sense the magnetic field variation generated by both North and South magnetic poles of each discrete magnet of the plurality of magnets 61, 62, 63, 64 when the shaft 69 pivots as the opening/closing mechanism moves either from an open to close or a close to open position. As depicted the magnetic field sensor 67 may be placed on a printed circuit board (PCB) 66. An optional second magnetic field sensor 65 may be placed on opposite side of the PCB 66 or both magnetic fields sensors may be placed next to each other on one side of the PCB 66. The magnetic field sensor and the optional second magnetic field sensor may be of the same type and provide mutually redundant signals. One benefit of having two magnetic sensors of the same type providing redundant signals is to improve precision and reliability of the sensed shaft's 69 angular position. Alternatively, the magnetic field sensor 67 and the optional second magnetic field sensor 65 may be of different sensor type and/or provide a different signal. In one example the magnetic field sensor 67 may comprise a Hall effect switch type magnetic sensor or more specifically a unipolar Hall effect switch type sensor.

Figure 5:
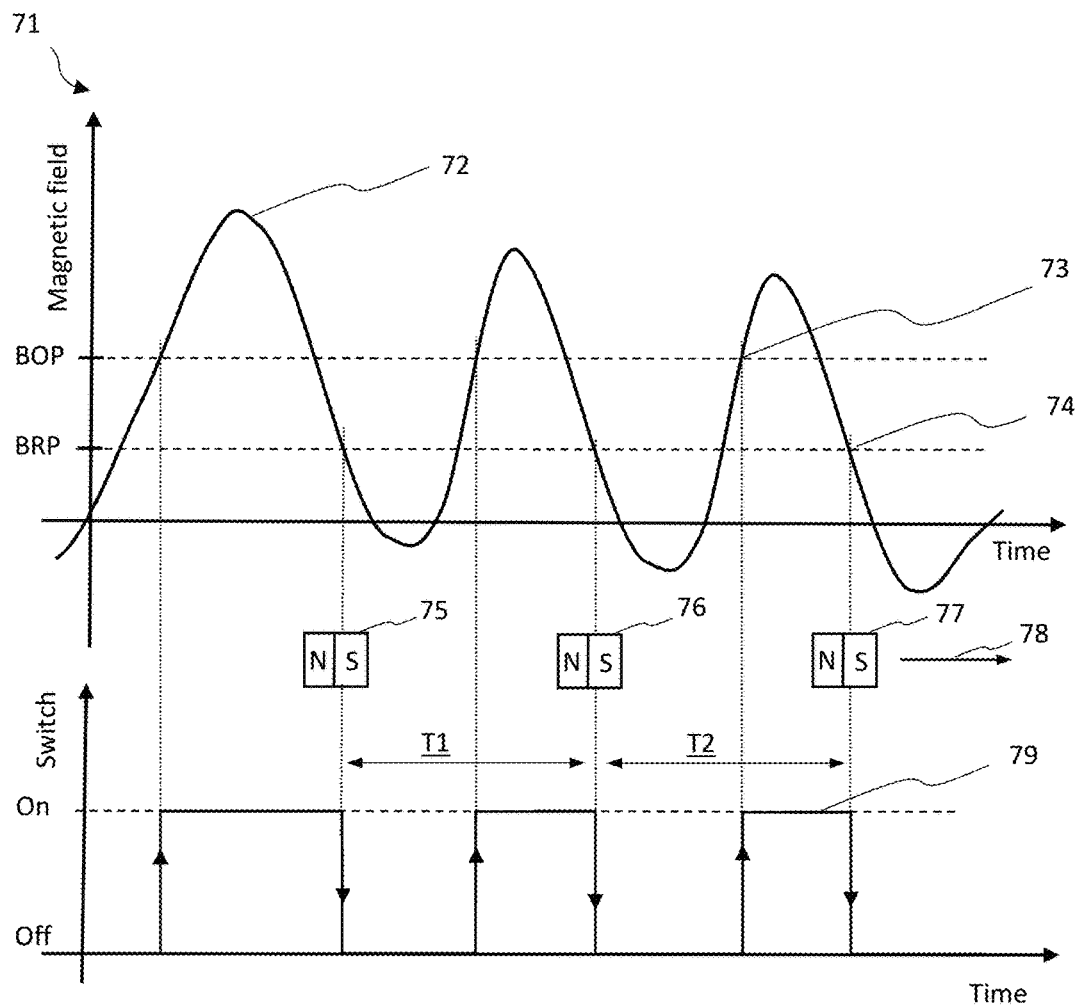
FIG. 5 depicts an exemplary illustration showing an operation of a Hall effect unipolar switch type sensor when magnets pass the sensor during shaft's rotation.

One possible example of utilization of such unipolar Hall effect switch type sensor as the magnetic field sensor 67 is depicted in FIG. 5 showing an exemplary implementation of the unipolar Hall effect switch type sensor for sensing a magnetic field generated by the discrete magnets of the plurality magnets 75, 76, 77 as they pass the unipolar Hall effect switch type sensor when the shaft 5, 34, 54, 69 rotates. Arrow 78 shows a direction of magnets movement in time as the shaft rotates and a curve 72 shows an intensity of sensed magnetic field of the plurality of magnets 75, 76, 77 as they pass in time the unipolar Hall effect switch type sensor. As depicted the unipolar Hall effect switch type sensor of FIG. 5 may have a first and second switching point thresholds BRP, BOP triggered by a level of a positive magnetic field. In one example the magnetic field sensor 67 may comprise a unipolar Hall effect switch type sensor having a first switching point BOP set between 0.006 Tesla (60 gauss) and 0.0245 Tesla (245 gauss) and the second switching point BRP set between 0.003 Tesla (30 gauss) and 0.009 Tesla (90 gauss). As depicted in FIG. 5 the first switching point BOP may be a magnetic field threshold 73 for switching the unipolar Hall effect type switch on and the second switching point BRP may be a magnetic field threshold 74 for switching the unipolar Hall effect type switch off.

Curve 79 depicts a switching dependence of the unipolar Hall effect switch type sensor on the intensity of the sensed magnetic field. In one example falling edges of the unipolar Hall effect switch type sensor output, as it is switched from on to off, may be used for determining time duration T1, T2 that takes two or more magnets of the plurality of magnets 75, 76, 77 to pass the unipolar Hall effect switch type sensor as the shaft rotates 5, 34, 54, 69. The time duration T1, T2 together with a known angular positions of the discrete magnets of the plurality of magnets 75, 76, 77 can be used to determine a rotational speed of the shaft 5, 34, 54, 69. As shown in FIG. 5 each discrete magnet of the plurality of magnets 75, 76, 77 is directionally magnetized so that it has both North and South magnetic pole on the side that passes the Hall effect switch type sensor employed as the magnetic field sensor 67. There may be more than three discrete magnets of the plurality of magnets used 75, 76, 77. Additionally, the discrete magnets 75, 76, 77 of FIG. 5 may be three of four magnets depicted in FIG. 4 and the Hall effect sensor may be used in the exemplary arrangement of the plurality of discrete magnets as depicted in FIG. 4 and described in the embodiment of FIG. 3. One benefit of such arrangement is that it is possible to achieve a high switching point accuracy of less than 1 degree of shaft's rotation. Another benefit of using a Hall effect switch type magnetic sensor is its very low cost. Further benefit is in sensing robustness as the Hall effect switch reacts only to a fixed threshold level of magnetic field that is assured by the presence of both magnetic poles that the magnetic field sensor 67 senses for each of the discrete magnets of the plurality of magnets 61, 62, 63, 64. In case of the optional magnetic field sensor 65 is used it may also comprise a Hall effect switch type magnetic sensor or more specifically a unipolar Hall effect switch type magnetic field sensor.

Figure 6:
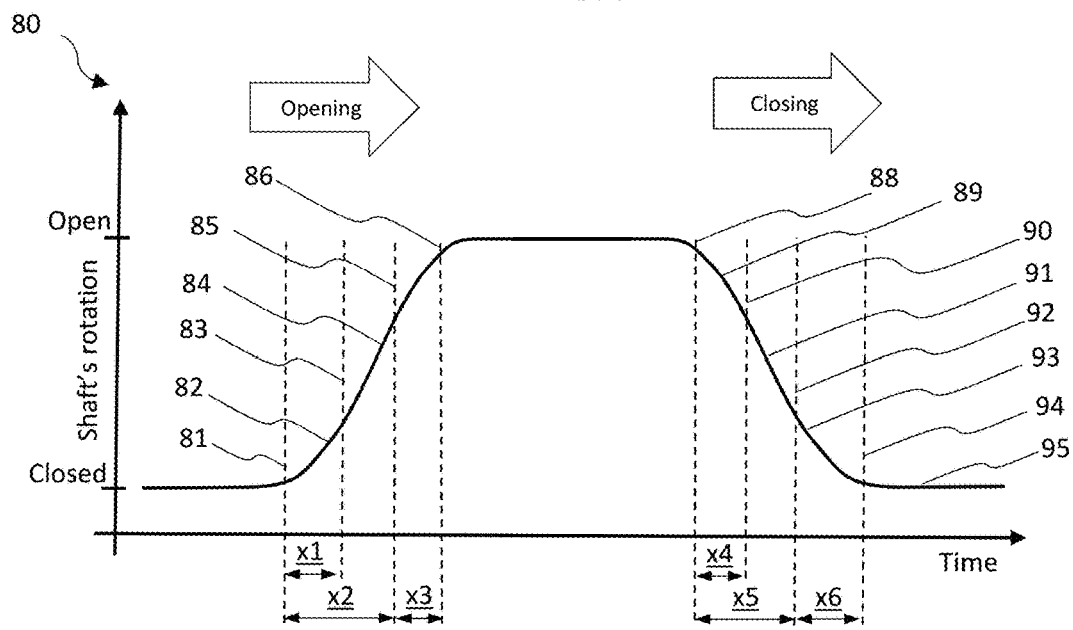
FIG. 6 depicts an exemplary illustration showing a graph of a shaft's rotation versus time during an actuation of the opening/closing mechanism.

Moving to FIG. 6, an exemplary illustration showing a graph 80 of a shaft's 5, 34, 54, 69 rotation versus time during an actuation of the opening/closing mechanism between its closed and open states. The shaft's 5, 34, 54, 69 angular position versus time during the actuation of the opening/closing mechanism is graphically represented as a line 95. Each intersections of the line 95 by a dashed line 81, 83, 85, 86, 88, 90, 92, and 94 depicts an exemplary point where a magnet of the plurality of magnets 22, 23, 24, 25, 41, 42, 43, 44, 61, 62, 63, 64 passes the magnetic field sensor 7, 32, 49, 67 as the shaft 5, 34, 54, 69 rotates. These intersections relate to specific shaft's angular positions a1, a2, a3 and a4 as defined above and shown in FIG. 3 that correspond to specific positions of the opening/closing mechanism between its open and closed state. As described above the magnetic field sensor 7, 32, 49, 67 generates a signal when it senses the magnetic field generated by the respective magnet passing the magnetic field sensor 7, 32, 49, 67. Based on the signals the processing circuitry 8, 30, 47 may compute an angular speed of the shaft 5, 34, 54, 69 as the shaft pivots in one direction. The processing circuitry 8, 30, 47 may compute plurality of angular speeds of the shaft 5, 34, 54, 69 as it rotates in one direction based on depicted time durations x1, x2, x3, x4, x5, x6 between the signals generated by the magnetic field sensor and known specific shaft's angular positions a1, a2, a3 and a4 defined by the plurality of magnets 22, 23, 24, 25, 41, 42, 43, 44, 61, 62, 63, 64. Each of the plurality of angular speeds then may be related to a speed of partial actuation of the opening/closing mechanism between its closed and open states. In other words, as the opening/closing mechanism actuates between its closed and open state the speed of the actuation may not be linear and may be advantageously divided into plurality of speeds each related to a particular portion of an actuation movement that can be advantageously related to a movement of a particular electrical circuit that the opening/closing mechanism selectively open and close. In one example such portions of interest may closely relate to an opening speed, closing speed, damping speed. Such portions may be further related to a rebound and holding of an electrical circuit of a circuit breaker. Graph 80 of FIG. 5 will be further used in description of flow diagrams depicting in following embodiments of a method of monitoring a switch gear device.

Figure 7:
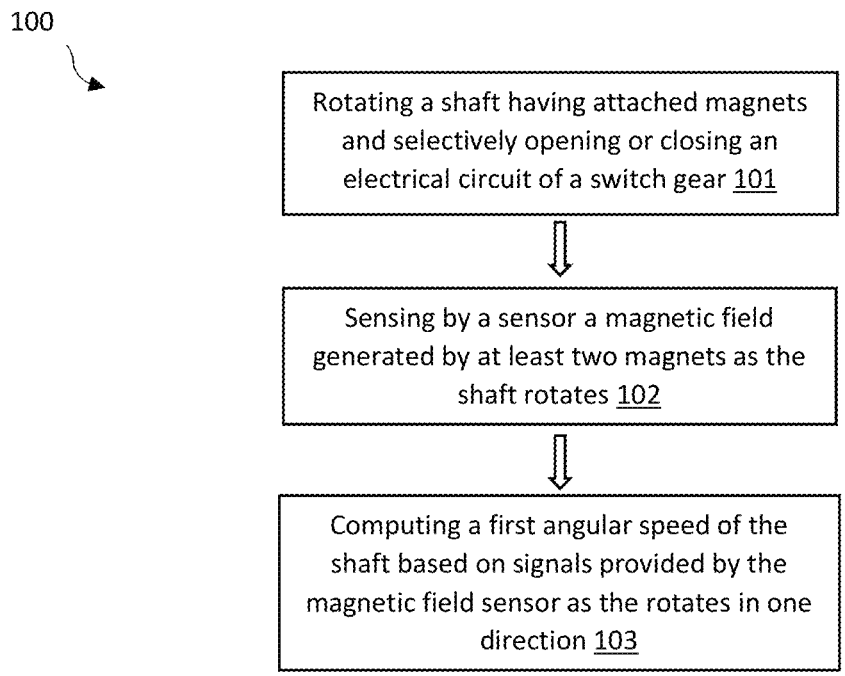
FIG. 7 depicts an exemplary flow diagram of a method of monitoring a switch gear device.

Moving to FIG. 7, that depicts an exemplary flow diagram of a method 100 of monitoring a switch gear 9 as for example shown in FIG. 1 and further detailed in any of FIG. 2, 3 or 4. The method 100 may begin at step 101 by rotating a shaft 5, 34, 54, 69 of an opening/closing mechanism and selectively opening or closing by the opening/closing mechanism an electrical circuit of the switch gear 9. The shaft 5, 34, 54, 69 may be pivotally mounted to rotate about a pivot axis 3, 33 and the shaft 5, 34, 54, 69 has a fixedly attached a plurality of magnets 22, 23, 24, 25, 41, 42, 43, 44, 61, 62, 63, 64 spaced from each other. The plurality of magnets 22, 23, 24, 25, 41, 42, 43, 44, 61, 62, 63, 64 may be attached to the shaft 5, 34, 54, 69 as shown in FIG. 2, 3 or 4. The method in step 102 senses, by a magnetic field sensor 7, 32, 49, 67, a magnetic field generated by at least two magnets of the plurality of magnets 22, 23, 24, 25, 41, 42, 43, 44, 61, 62, 63, 64, as the shaft 5, 34, 54, 69 rotates. Each magnet of the plurality of magnets 22, 23, 24, 25, 41, 42, 43, 44, 61, 62, 63, 64 may define a different angular position of the shaft 5, 34, 54, 69 in which the magnetic field sensor 7, 32, 49, 67 senses a respective magnet of plurality of magnets. In step 103 a processing circuitry 8, 30, 47 computes a first angular speed of the shaft 5, 34, 54, 69 based on signals provided by the magnetic field sensor 7, 32, 49, 67 when it senses the magnetic field generated by the at least two magnets of the plurality of magnets 22, 23, 24, 25, 41, 42, 43, 44, 61, 62, 63, 64 as the shaft 5, 34, 54, 69 rotates in one direction. As shown in the FIG. 2, 3 or 4 the plurality of magnets may comprise four discrete magnets 22, 23, 24, 25, 44, 43, 42, 41, 64, 63, 62, 61, where each of the four discrete magnets defines an angular position of the shaft 5, 34, 54, 69 that corresponds to a specific position of the opening/closing mechanism between its open and closed state. Depending on the monitored switch gear 9 an angular position and number of discrete magnets may vary and there may be a different number, for instance 2, 3 or 5 or more, of magnets comprised in the plurality of magnets 22, 23, 24, 25, 44, 43, 42, 41, 64, 63, 62, 61. In one exemplary implementation an open position of the opening/closing mechanism is defined as an angular position of the shaft with respect to the magnetic field sensor 7, 32, 49, 67 of 0 degrees and the closed position of the opening/closing mechanism is defined as an angular position of the shaft 54 of A degrees. Then four discrete magnets of the plurality of magnets 22, 23, 24, 25, 44, 43, 42, 41, 64, 63, 62, 61 may include a first magnet 22, 41, 61 which defines a first angular position 50 of the shaft 54 of a1 degrees, a second magnet 23, 42, 62 which defines a second angular position 51 of the shaft of a2 degrees, a third magnet 24, 43, 63 which defines a third angular position 53 of the shaft of a3 degrees and a fourth magnet 25, 44, 64 which defines a fourth angular position 53 of the shaft 54 of a4 degrees, with a4>a3>a2>a1.

In one exemplary implementation, a1 is comprised between 4% of A and 14% of A, a2 is comprised between 20% of A and 36% of A, a3 is comprised between 40% of A and 60% of A and a4 is comprised between 70% of A and 90% of A. Shaft 5, 34, 54, 69 complete angular movement in one direction A may be comprised between 40 and 60 degrees. In yet another exemplary implementation A is comprised between 49 and 51 degrees, a1 is comprised between 5 and 7 degrees, a2 is comprised between 16 and 18 degrees, a3 is comprised between 27 and 29 degrees and a4 is comprised between 39 and 41 degrees.

Figure 8:
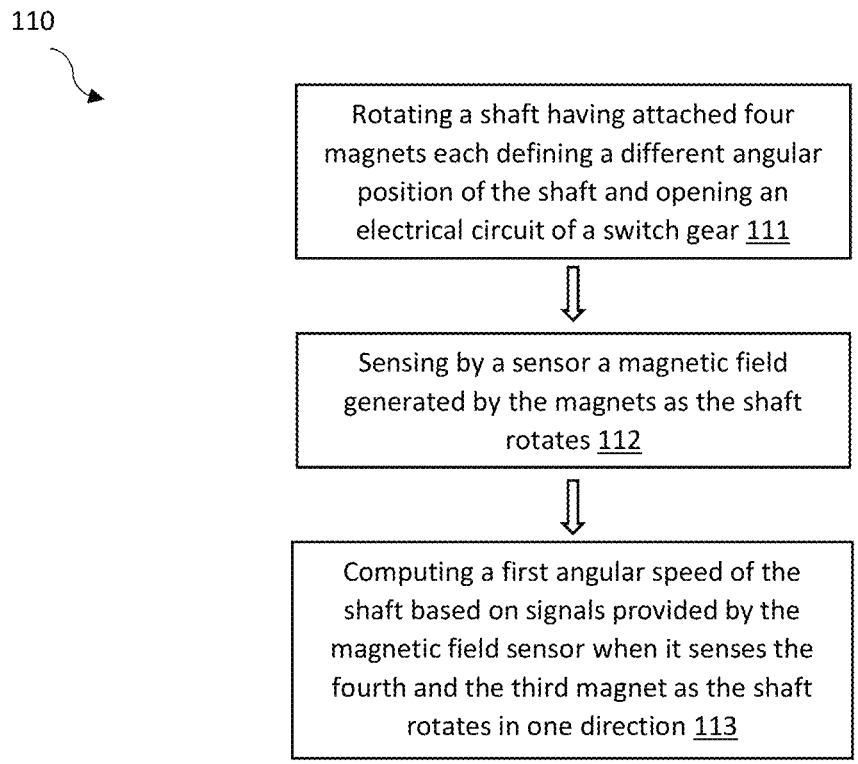
FIG. 8 depicts an exemplary flow diagram of an opening phase of the switch gear device in the method of monitoring a switch gear device.

Shown in FIG. 8 is an exemplary flow diagram detailing an opening phase 110 of the method 100 of monitoring a switch gear 9. The opening phase 110, begins by rotating the shaft 5, 34, 54, 69 having attached four discrete magnets 22, 23, 24, 25, 41, 42, 43, 44, 61, 62, 63, 64 each magnet defining a different angular a1, a2, a3, a4 position of the shaft 5, 34, 54, 69 and opening an electrical circuit of the switch gear 9. In a step 112 then the magnetic field sensor 7, 32, 49, 67 senses a magnetic field generated by at least two magnets of the plurality of magnets 22, 23, 24, 25, 41, 42, 43, 44, 61, 62, 63, 64 as the shaft 5, 34, 54, 69 rotates. Then, in step 113, the processing circuitry 8, 30, 47 computes a first angular speed of the shaft 5, 34, 54, 69 based on signals provided by the magnetic field sensor 7, 32, 49, 67 when it senses the fourth 25, 44, 64 and the third magnet 24, 43, 63 as the shaft rotates. In FIG. 6 the opening phase 110 of the method 100 is illustrated as a portion of the line 95 that represents the shaft's 5, 34, 54, 69 angular position versus actuating time as described above. Intersections of the line 95 by dashed lines 81, 83, 85, 86 depicts exemplary points where a magnet of the plurality of magnets 22, 23, 24, 25, 41, 42, 43, 44, 61, 62, 63, 64 passes, and is sensed by, the magnetic field sensor 7, 32, 49, 67 as the shaft 5, 34, 54, 69 rotates during the opening phase 110. In the example shown in FIG. 6 the first angular speed relates to time durations x1 and intersections of the line 95 by dashed lines 81 and 83 and area 82 corresponding to signals provided by the magnetic field sensor 7, 32, 49, 67 when it senses the fourth 25, 44, 64 and the third 24, 43, 63 magnet as the shaft 5, 34, 54, 69 rotates. One benefit of calculating the first angular speed is that its value can be closely correlated to an opening speed, in one example an initial opening speed, of the switch gear being monitored. In such case computation of the first angular speed may provide a useful information concerning status of the switch gear 9 contacts being opened. Change of the first angular speed then may be indicative for instance of a corrosion or micro welds of the contacts.

In one example, as depicted in FIG. 9, the opening phase 110 of the method 100 of monitoring a switch gear 9 may comprises a step 121 of rotating the shaft 5, 34, 54, 69 of the opening/closing mechanism and opening the electrical circuit of the switch gear 9. The opening phase 110 of the method 100 of monitoring a switch gear 9 may further comprises step 123 of computing a second angular speed of the shaft 5, 34, 54, 69 based on signals provided by the magnetic field sensor 7, 32, 49, 67 when it senses the fourth 25, 44, 64 and the second 23, 42, 62 magnet as the shaft 5, 34, 54, 69 rotates. In the example shown in FIG. 6 the second angular speed relates to time durations x2 and intersections of the line 95 by dashed lines 81 and 84 and areas 82 and 84 corresponding to signals provided by the magnetic field sensor 7, 32, 49, 67 when it senses the fourth 25, 44, 64 and the second 23, 42, 62 magnet as the shaft 5, 34, 54, 69 rotates. One benefit of calculating the second angular speed is that its value can be closely correlated to an overall opening speed of the switch gear 9. In such case monitoring of the first angular speed may provide a useful information concerning status of switch gear opening. Change of the second angular speed then may be indicative for instance of mechanical issues negatively influencing opening speed of the switch gear that may be an important quality for some switch gear devices such as circuit breakers or contactors.

Optionally, the opening phase 110 of the method 100 of monitoring a switch gear 9 may further comprises a step 131, depicted on FIG. 10, comprising continuation of rotating the shaft 5, 34, 54, 69 and computing a third angular speed of the shaft based on signals provided by the magnetic field sensor 7, 32, 49, 67 when it senses the second and the first magnet as the shaft 5, 34, 54, 69 rotates. In the example shown in FIG. 6 the third angular speed relates to time durations x3 and intersections of the line 95 by dashed lines 85 and 86 corresponding to signals provided by the magnetic field sensor when it senses the second 23, 42, 62 and the first 22, 41, 61 magnet as the shaft 5, 34, 54, 69 rotates. One benefit of calculating the third angular speed is that its value may provide a useful information concerning status of a dampening mechanism optionally utilized in switch gears to eliminate contact bouncing upon opening.

Figure 11:
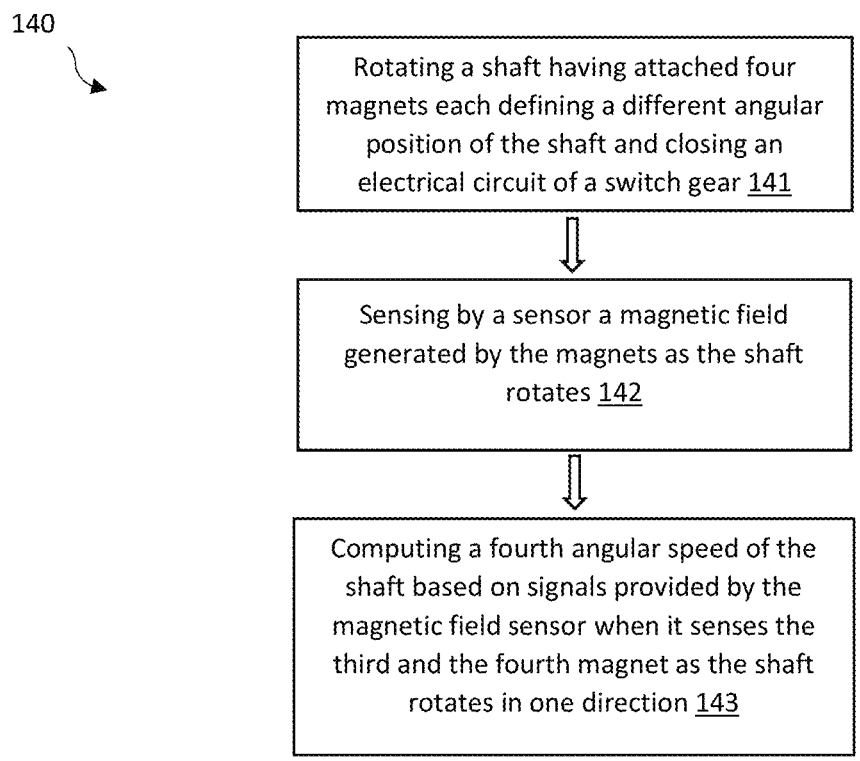
FIG. 11 depicts an exemplary flow diagram of a closing phase of the switch gear device in the method of monitoring a switch gear device.

Shown in FIG. 11 is an exemplary flow diagram detailing a closing phase 140 of the method 100 of monitoring a switch gear 9. The closing phase 140 begins with a step 141 of rotating the shaft 5, 34, 54, 69 having attached four discrete magnets each magnet defining a different angular a1, a2, a3, a4 position of the shaft 5, 34, 54, 69 and closing an electrical circuit of the switch gear 9. As the shaft 5, 34, 54, 69 rotates the magnetic field generated by the discrete magnets 22, 23, 24, 25, 41, 42, 43, 44, 61, 62, 63, 64 is sensed 142 by the magnetic field sensor 7, 32, 49, 67 and a fourth angular speed is computed based on signals provided by the magnetic field sensor 7, 32, 49, 67 when it senses the third 24, 43, 63 and the fourth 25, 44, 64 magnet as the shaft 5, 34, 54, 69 rotates in one direction. In FIG. 6 the closing phase 140 of the method 100 is illustrated as intersections of the line 95 by dashed lines 88, 90, 92 and 94 depicting exemplary points where a magnet of the plurality of magnets 22, 23, 24, 25, 41, 42, 43, 44, 61, 62, 63, 64 passes, and is sensed by, the magnetic field sensor 7, 32, 49, 67 as the shaft 5, 34, 54, 69 rotates during the closing phase 140. In the example shown in FIG. 6 the fourth angular speed relates to time duration x6 and intersections of the line 95 by dashed lines 92 and 94 and area 93 corresponding to signals provided by the magnetic field sensor 7, 32, 49, 67 when it senses the third 24, 43, 63 and the fourth 25, 44, 64 magnet as the shaft 5, 34, 54, 69 rotates in one direction. One benefit of calculating the fourth angular speed is that its value may provide a useful information concerning status of a dampening mechanism optionally utilized in switch gears to eliminate contact bouncing upon closing the electrical contacts.

What is claimed is:

1. A monitored switch gear device comprising:
   a switch gear including an opening/closing mechanism adapted to selectively open and close an electrical circuit, the opening/closing mechanism comprising a pivotally mounted shaft configured to rotate about a pivot axis as the opening/closing mechanism moves between an open and a closed state;
   a plurality of magnets spaced from each other and fixedly attached to the shaft;
   a magnetic field sensor configured to sense a magnetic field generated by each magnet of the plurality of magnets as the shaft pivots, wherein each magnet of the plurality of magnets defines a different angular position of the shaft in which the magnetic field sensor senses a respective magnet of the plurality magnets;
   a processing circuitry configured to compute a first angular speed of the shaft based on signals provided by the magnetic field sensor when it senses a magnetic field generated by at least two magnets of the plurality of magnets as the shaft pivots in one direction.

2. The device of claim 1, wherein the plurality of magnets comprises four discrete magnets where each of the four discrete magnets defines an angular position of the shaft that corresponds to a specific position of the opening/closing mechanism between its open and closed state.

3. The device of claim 2, wherein an open position of the opening/closing mechanism is defined as an angular position of the shaft of 0 degrees and the closed position of the opening/closing mechanism is defined as an angular position of the shaft of A degrees, the four magnets including a first magnet which defines a first angular position of the shaft of a1 degrees, a second magnet which defines a second angular position of the shaft of a2 degrees, a third magnet which defines a third angular position of the shaft of a3 degrees and a fourth magnet which defines a fourth angular position of the shaft of a4 degrees, with a4>a3>a2>a1.

4. The device of claim 3, wherein a1 is comprised between 4% of A and 14% of A, a2 is comprised between 20% of A and 36% of A, a3 is comprised between 40% of A and 60% of A and a4 is comprised between 70% of A and 90% of A.

5. The device of claim 3, wherein the processing circuitry is configured to compute the first angular speed of the shaft based on signals provided by the magnetic field sensor when it senses the fourth and the third magnets as the shaft rotates and the opening/closing mechanism moves from the closed position to the open state.

6. The device of claim 5, wherein the processing circuitry is further configured to compute a third angular speed of the shaft based on signals provided by the magnetic field sensor when it senses the second and the first magnets as the shaft continues to rotate and the opening/closing mechanism moves from the closed position to the open state.

7. The device of claim 3, wherein the processing circuitry is configured to compute a second angular speed of the shaft based on signals provided by the magnetic field sensor when it senses the fourth and the second magnets as the shaft rotates and the opening/closing mechanism moves from the closed position to the open state.

8. The device of claim 3, wherein the processing circuitry is configured to compute a fourth angular speed of the shaft based on signals provided by the magnetic field sensor when it senses the third and fourth magnets as the shaft rotates and the opening/closing mechanism moves from the open position to the closed state.

9. The device of claim 1, wherein the magnetic field sensor comprises a unipolar Hall effect switch type sensor.

10. A method of monitoring a switch gear device, the method comprising:
    rotating a shaft of an opening/closing mechanism and selectively opening or closing by the opening/closing mechanism an electrical circuit of a switch gear, wherein the shaft is pivotally mounted to rotate about a pivot axis and the shaft has a fixedly attached a plurality of magnets spaced from each other;
    sensing by a magnetic field sensor a magnetic field generated by at least two magnets of the plurality of magnets as the shaft rotates, wherein each magnet of the plurality of magnets defines a different angular position of the shaft in which the magnetic field sensor senses a respective magnet of the plurality of magnets; and computing by a processing circuitry a first angular speed of the shaft based on signals provided by the magnetic field sensor when it senses the magnetic field generated by the at least two magnets of the plurality of magnets as the shaft rotates in one direction.

11. The method of claim 10, wherein the plurality of magnets comprises four discrete magnets where each of the four discrete magnets defines a different angular position of the shaft that corresponds to a specific travel position of the opening/closing mechanism between its open and closed state, wherein an open position of the opening/closing mechanism is defined as an angular position of the shaft of 0 degrees and the closed position of the opening/closing mechanism is defined as an angular position of the shaft of A degrees, the four magnets including a first magnet which defines a first angular position of the shaft of a1 degrees, a second magnet which defines a second angular position of the shaft of a2 degrees, a third magnet which defines a third angular position of the shaft of a3 degrees and a fourth magnet which defines a fourth angular position of the shaft of a4 degrees, with a4>a3>a2>a1.

12. The method of claim 11, wherein a1 is comprised between 4% of A and 14% of A, a2 is comprised between 20% of A and 36% of A, a3 is comprised between 40% of A and 60% of A and a4 is comprised between 70% of A and 90% of A.

13. The method of claim 11, the method comprising:
rotating the shaft of the opening/closing mechanism and opening the electrical circuit of the switch gear;
computing by the processing circuitry the first angular speed of the shaft based on signals provided by the magnetic field sensor when it senses the fourth and the third magnet as the shaft rotates.

14. The method of claim 13, the method further comprising:
continue rotating the shaft and computing a third angular speed of the shaft based on signals provided by the magnetic field sensor when it senses the second and the first magnet as the shaft rotates.

15. The method of claim 11, the method comprising:
rotating the shaft of the opening/closing mechanism and opening the electrical circuit of the switch gear;
computing a second angular speed of the shaft based on signals provided by the magnetic field sensor when it senses the fourth and the second magnet as the shaft rotates.

16. The method of claim 11, the method comprising:
rotating the shaft of the opening/closing mechanism and closing the electrical circuit of the switch gear;
computing a fourth angular speed of the shaft based on signals provided by the magnetic field sensor when it senses the third and fourth magnets as the shaft rotates in one direction.

* * * * *